(12) United States Patent
Yan et al.

(10) Patent No.: US 8,005,448 B1
(45) Date of Patent: Aug. 23, 2011

(54) RADIO FREQUENCY DUPLEX FILTER FOR REMOVING TRANSMIT SIGNALS FROM A RECEIVE PATH

(75) Inventors: Kelvin Kai Tuan Yan, Oak Ridge, NC (US); Dong-Jun Yang, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 1092 days.

(21) Appl. No.: 11/747,032

(22) Filed: May 10, 2007

(51) Int. Cl.
*H04B 17/00* (2006.01)
(52) U.S. Cl. ........ 455/226.1; 455/81; 455/121; 455/193
(58) Field of Classification Search ................ 455/226.1
See application file for complete search history.

(56) References Cited

U.S. PATENT DOCUMENTS

| | | | | |
|---|---|---|---|---|
| 4,734,664 | A * | 3/1988 | Hikita et al. ............... | 333/193 |
| 5,512,866 | A * | 4/1996 | Vangala et al. ............ | 333/134 |
| 7,123,884 | B2 * | 10/2006 | Nakakubo et al. ......... | 455/81 |
| 2005/0085200 | A1 * | 4/2005 | Toncich .................. | 455/121 |
| 2007/0258600 | A1 * | 11/2007 | Cleveland et al. ....... | 381/71.11 |

OTHER PUBLICATIONS

Lee, Thomas H. et al., "5-GHz CMOS Wireless LANs," IEEE Transactions on Microwave Theory and Techniques, Jan. 2002, pp. 268-280, vol. 50, No. 1, IEEE.

* cited by examiner

*Primary Examiner* — Duc Nguyen
*Assistant Examiner* — Ajibola Akinyemi
(74) *Attorney, Agent, or Firm* — Winthrow & Terranova, P.L.L.C.

(57) ABSTRACT

The present invention is an RF duplex filter that is used to remove transmit signals from the receive path of a full duplex transceiver. The RF duplex filter includes a notch filter for blocking signals at a transmit frequency and a bandpass filter for enhancing signals at a receive frequency. The notch filter is formed with series resonant elements and the bandpass filter is formed with parallel resonant elements. One embodiment of the present invention may include tunable resonant elements for tuning the notch filter to a transmit frequency, tuning the bandpass filter to a receive frequency, or both. Calibration circuitry may be included in the full duplex receiver for adjusting the tunable resonant elements. The present invention includes a method for calibrating the tunable resonant elements.

16 Claims, 17 Drawing Sheets

RADIO FREQUENCY DUPLEX FILTER FOR REMOVING TRANSMIT SIGNALS FROM A RECEIVE PATH

FIELD OF THE INVENTION

The present invention relates to radio frequency (RF) filters used in RF communications systems.

BACKGROUND OF THE INVENTION

RF filters are commonly used in RF communications circuits to remove signals at unwanted RF frequencies. An RF receiver may use RF filters to remove unwanted signals that have been received through an antenna, or signals from other circuitry, such as an RF transmitter. Some communications systems, known as full duplex systems, may transmit and receive signals simultaneously. Other communications systems, known as half duplex systems, may transmit and receive signals, but not simultaneously. Multimode systems may combine full duplex and half duplex modes of operation from different frequency bands. In a full duplex mode of operation, the transmit frequency is separated from the receive frequency to prevent interference between transmitted signals and received signals. The difference between the transmit frequency and the receive frequency is known as the duplex frequency.

RF receivers typically use RF bandpass filters to remove unwanted signals; however, in a system with a low duplex frequency, RF bandpass filters may be inadequate. Complex filtering may be required to remove transmit signals from the receive path. A common type of bandpass filter circuit is a surface acoustic wave (SAW) filter; however, in a multimode system, several SAW filters may be required to provide adequate filtering for multiple frequency bands. Some communications systems use a feature called receiver diversity, which provides multiple receive paths. In systems with receiver diversity, additional SAW filters may be required. An alternate type of filter is called a notch filter, which blocks signals at a notch frequency and passes signals at all other frequencies. A notch filter with a notch frequency at the transmit frequency may be placed in the receive path. Such a filter may be very effective at blocking unwanted signals at the transmit frequency. Filters that block signals at transmit frequencies and pass signals at receive frequencies are known as duplex filters, which may allow elimination of some SAW filters in receive paths; however, errors in the notch frequencies may reduce the effectiveness of such filters. In systems with a low duplex frequency, blocking signals at the transmit frequency without attenuating signals at the receive frequency may be difficult. Thus, there is a need for an RF duplex filter that blocks signals at the transmit frequency and passes signals at the receive frequency in systems with low duplex frequencies.

SUMMARY OF THE INVENTION

The present invention is an RF duplex filter that is used to remove transmit signals from the receive path of a full duplex transceiver. The RF duplex filter includes a notch filter for blocking signals at a transmit frequency and a bandpass filter for enhancing signals at a receive frequency. The notch filter is formed with series resonant elements and the bandpass filter is formed with parallel resonant elements. One embodiment of the present invention may include tunable resonant elements for tuning the notch filter to a transmit frequency, tuning the bandpass filter to a receive frequency, or both. Calibration circuitry may be included in the full duplex receiver for adjusting the tunable resonant elements. The present invention includes a method for calibrating the tunable resonant elements. The RF duplex filter may be coupled to the receive path, or integrated into a low noise amplifier (LNA) or an RF mixer. Active circuitry may be used to compensate for losses in the RF duplex filter.

The present invention may be used to replace SAW filters in the receive path. The RF duplex filter may include single-ended signals, differential signals, quadrature signals, or any combination thereof. The present invention may be used in a full duplex communications system, such as a Wideband Code Division Multiple Access (WCDMA) system, a half duplex communications system, such as Enhanced Data rate for Global Evolution (EDGE), or a multimode communications system that may include at least one full duplex operating mode, at least one half duplex operating mode, or both.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 3:
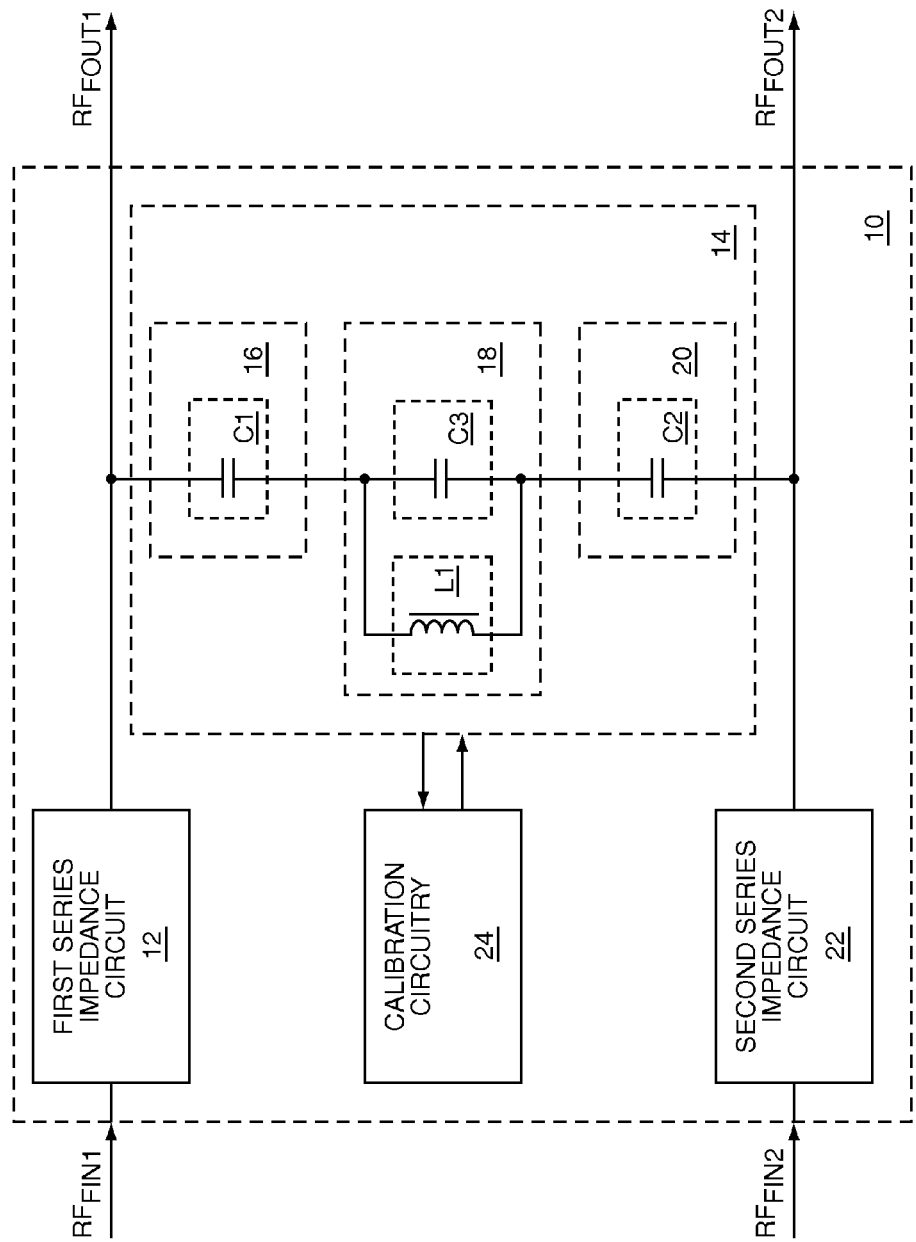
FIG. 3 shows details of the series resonant circuit illustrated in FIG. 2.
Figure 4:
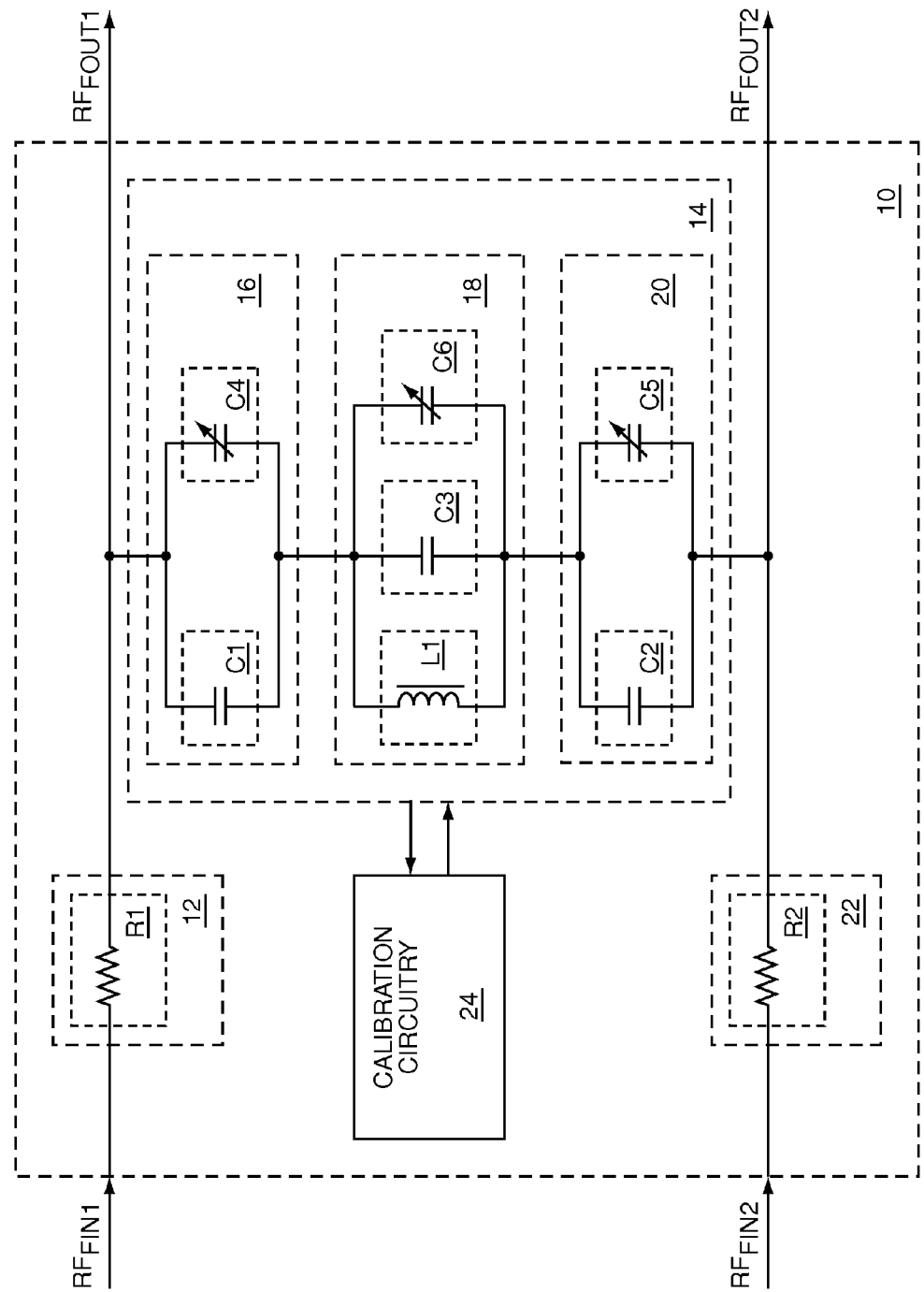

FIG. 4 adds tunable elements to the series resonant circuit illustrated in FIG. 3.

Figure 5:
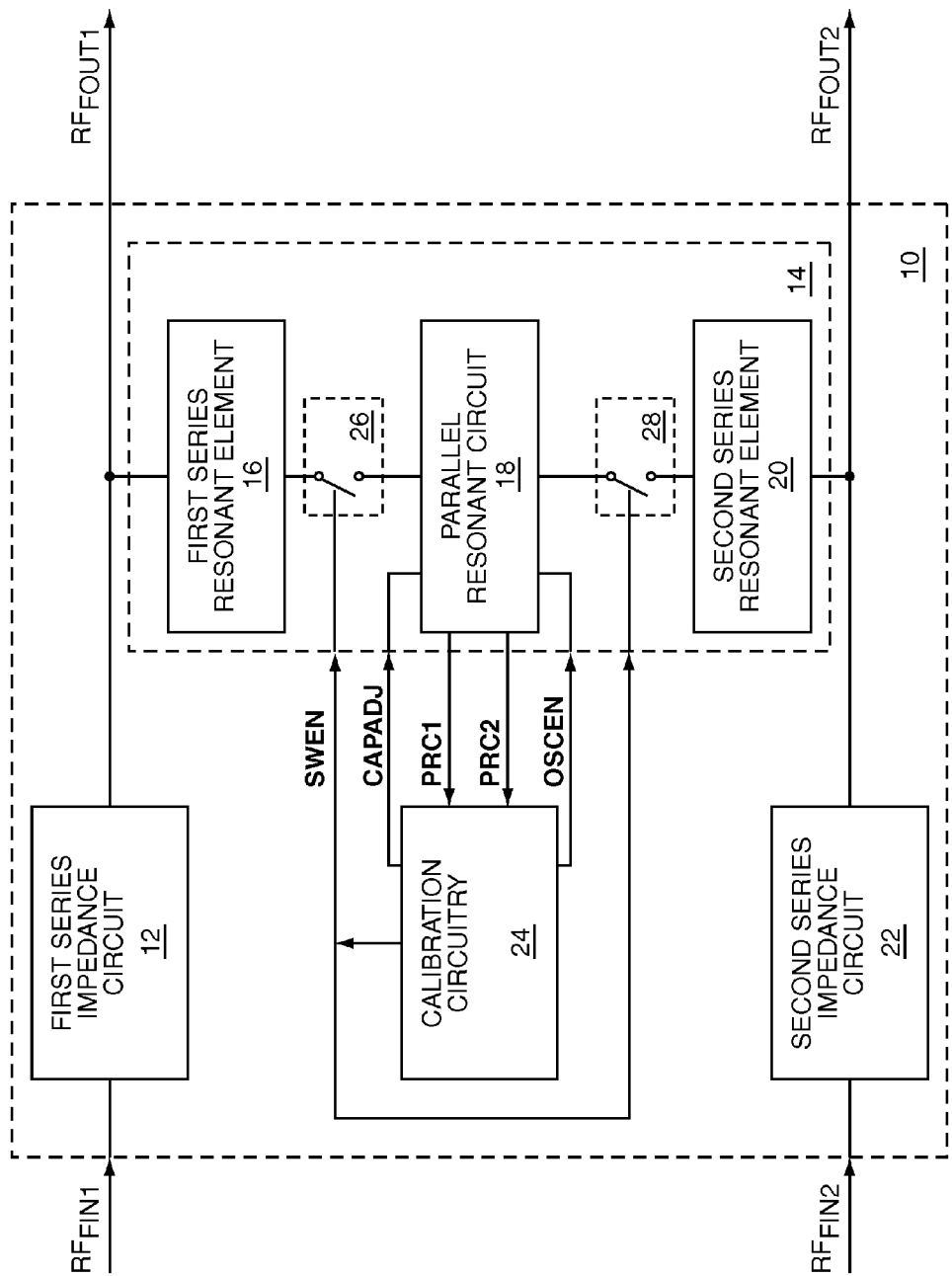

FIG. 5 adds calibration switches to the series resonant circuit illustrated in FIG. 4.

Figure 6:
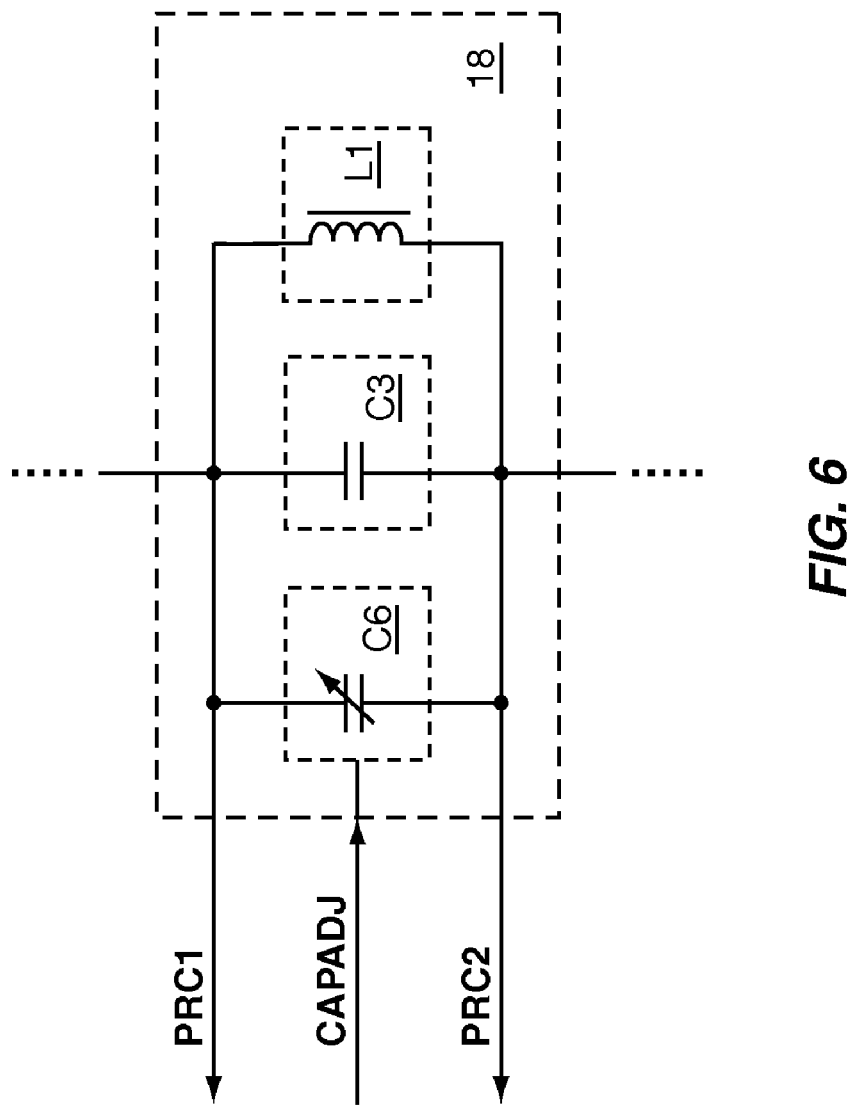

FIG. 6 shows details of the parallel resonant circuit illustrated in FIG. 5.

Figure 7:
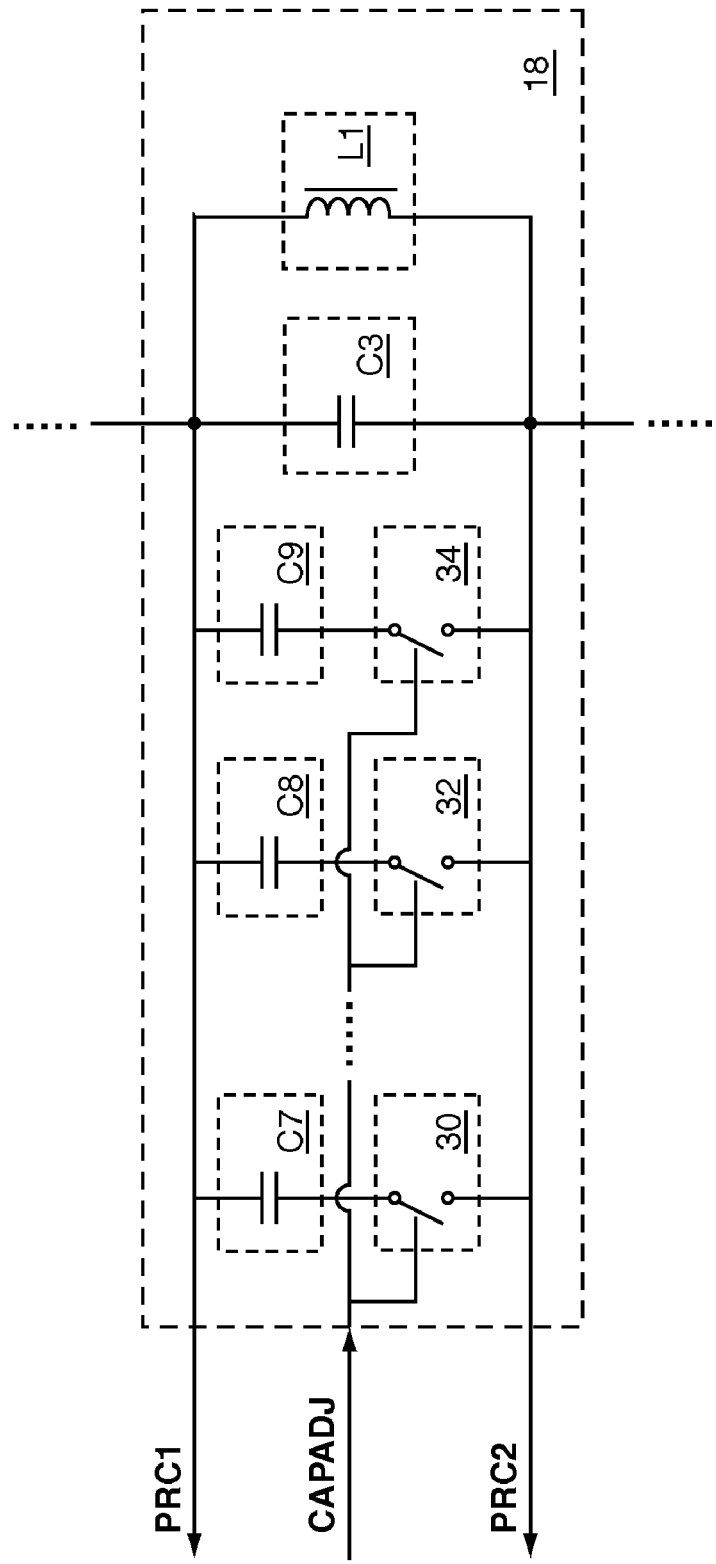

FIG. 7 adds a switched capacitor bank to the parallel resonant circuit illustrated in FIG. 6.

Figure 8:
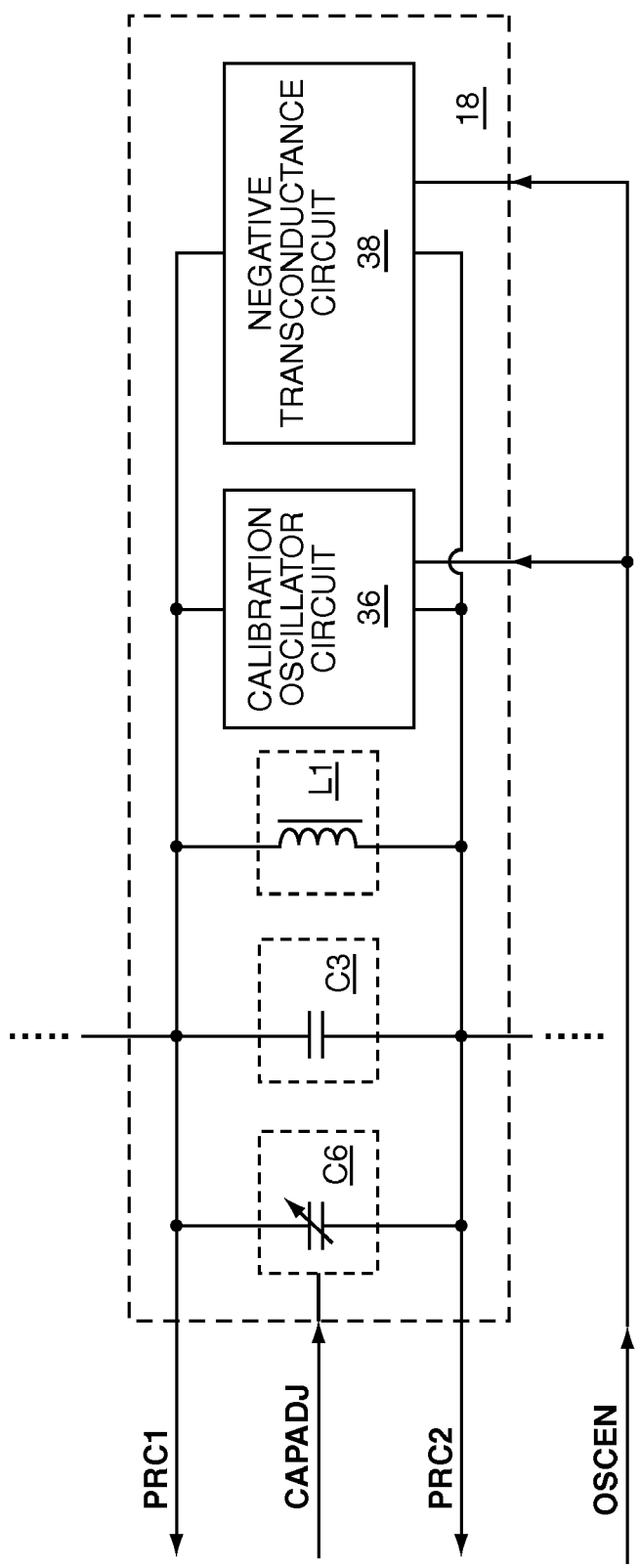

FIG. 8 adds a parallel resonant circuit with a calibration oscillator circuit and a negative transconductance circuit to the parallel resonant circuit illustrated in FIG. 6.

Figure 9:
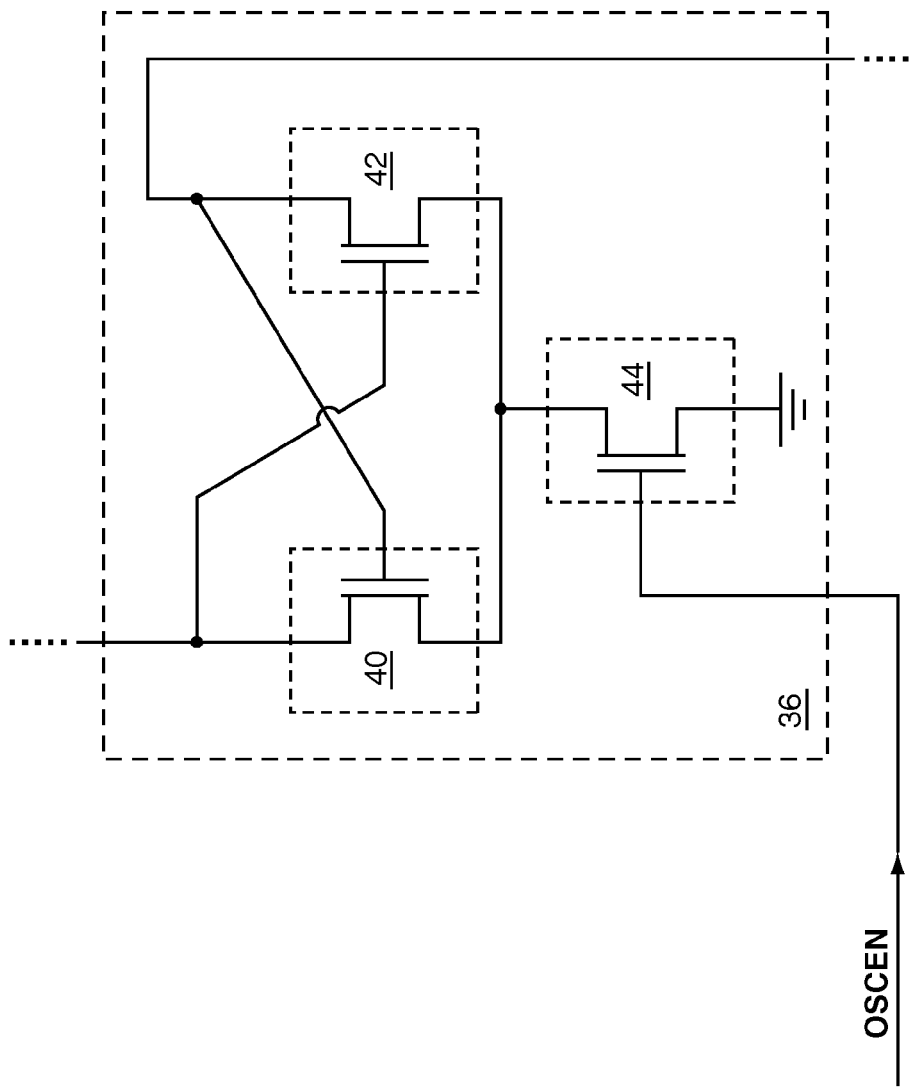

FIG. 9 shows details of the calibration oscillator circuit illustrated in FIG. 8.

Figure 10:
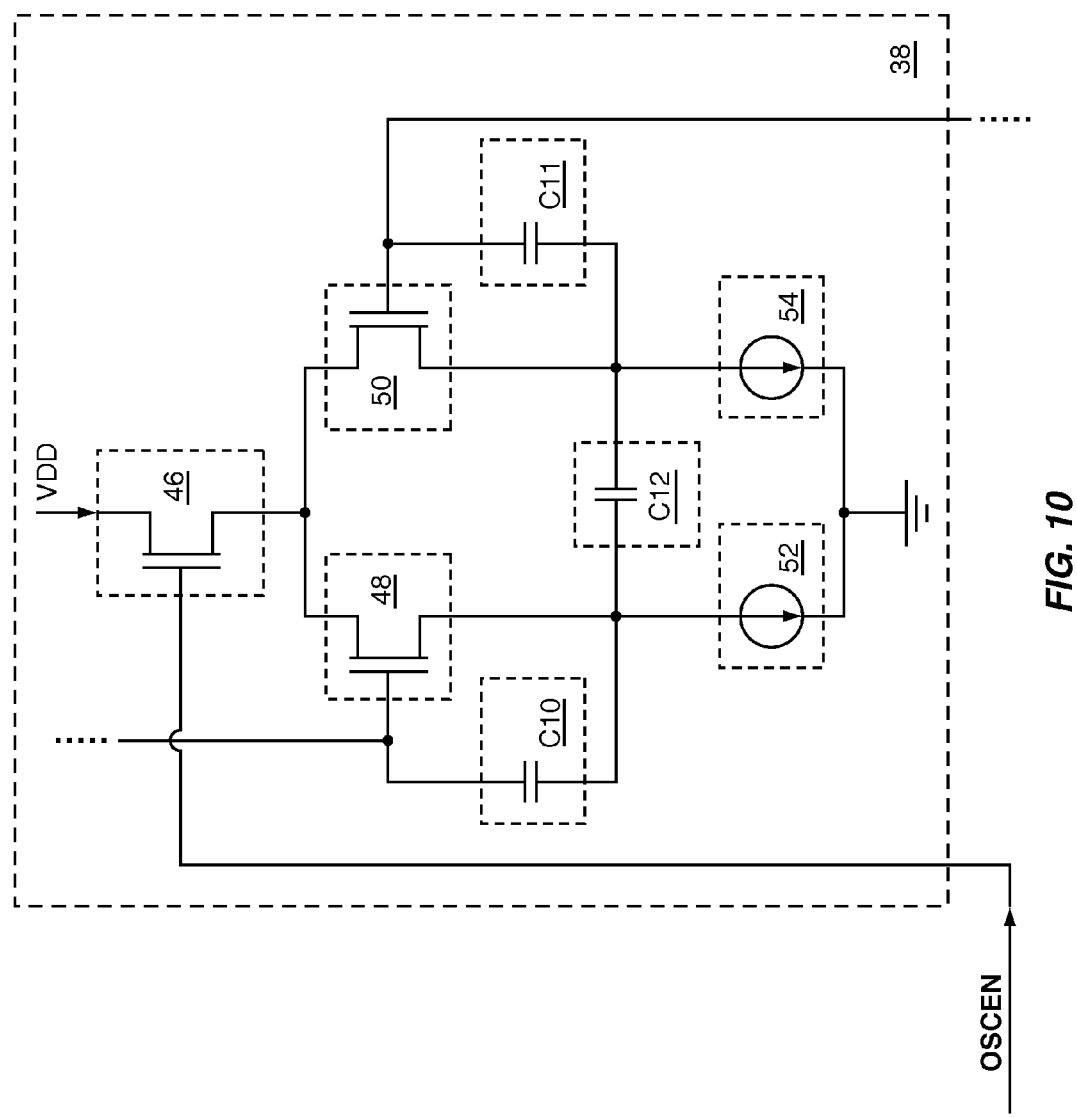

FIG. 10 shows details of the negative transconductance circuit illustrated in FIG. 8.

Figure 11:
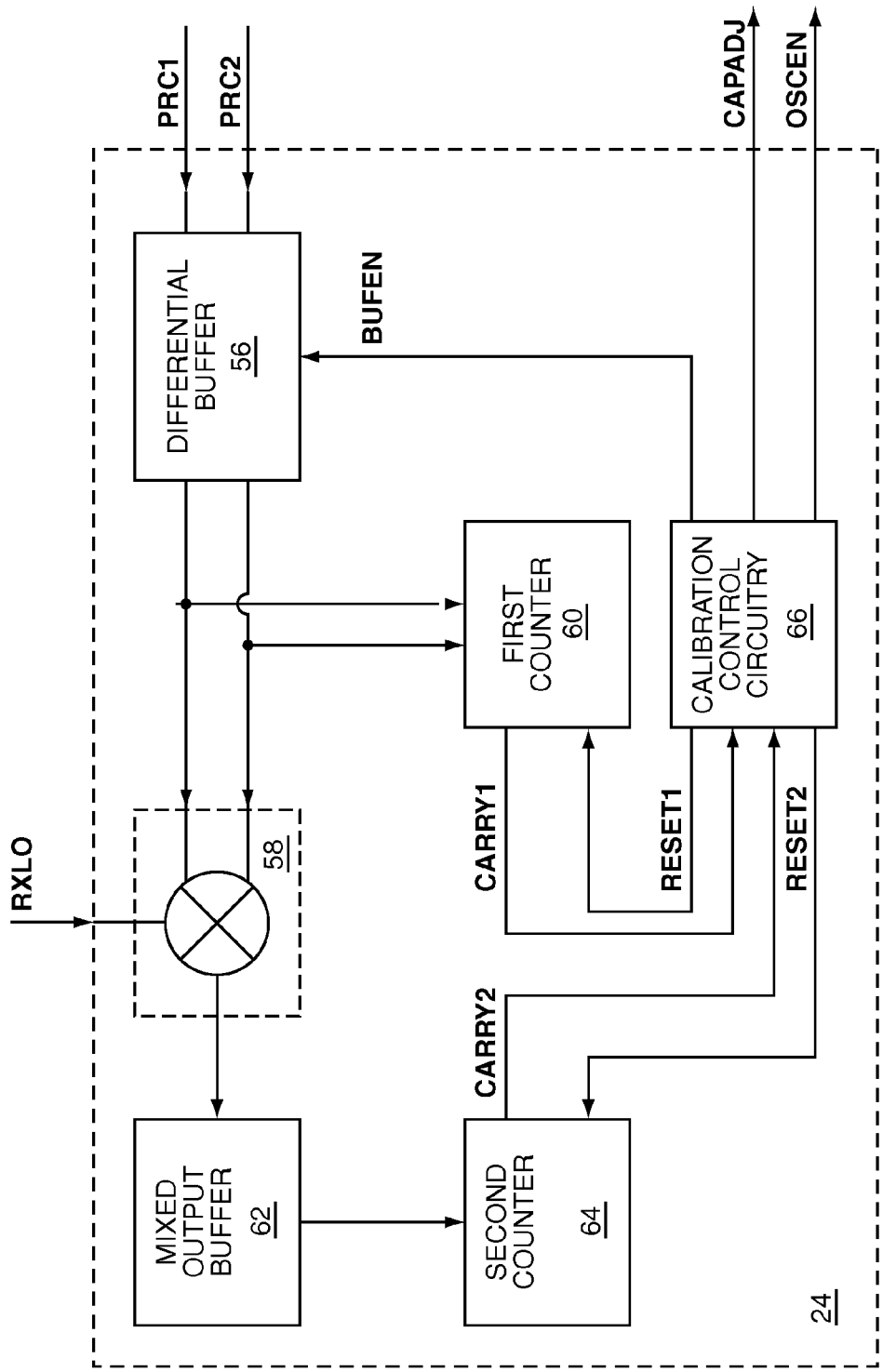

FIG. 11 shows details of the calibration circuitry illustrated in FIG. 5.

Figure 12:
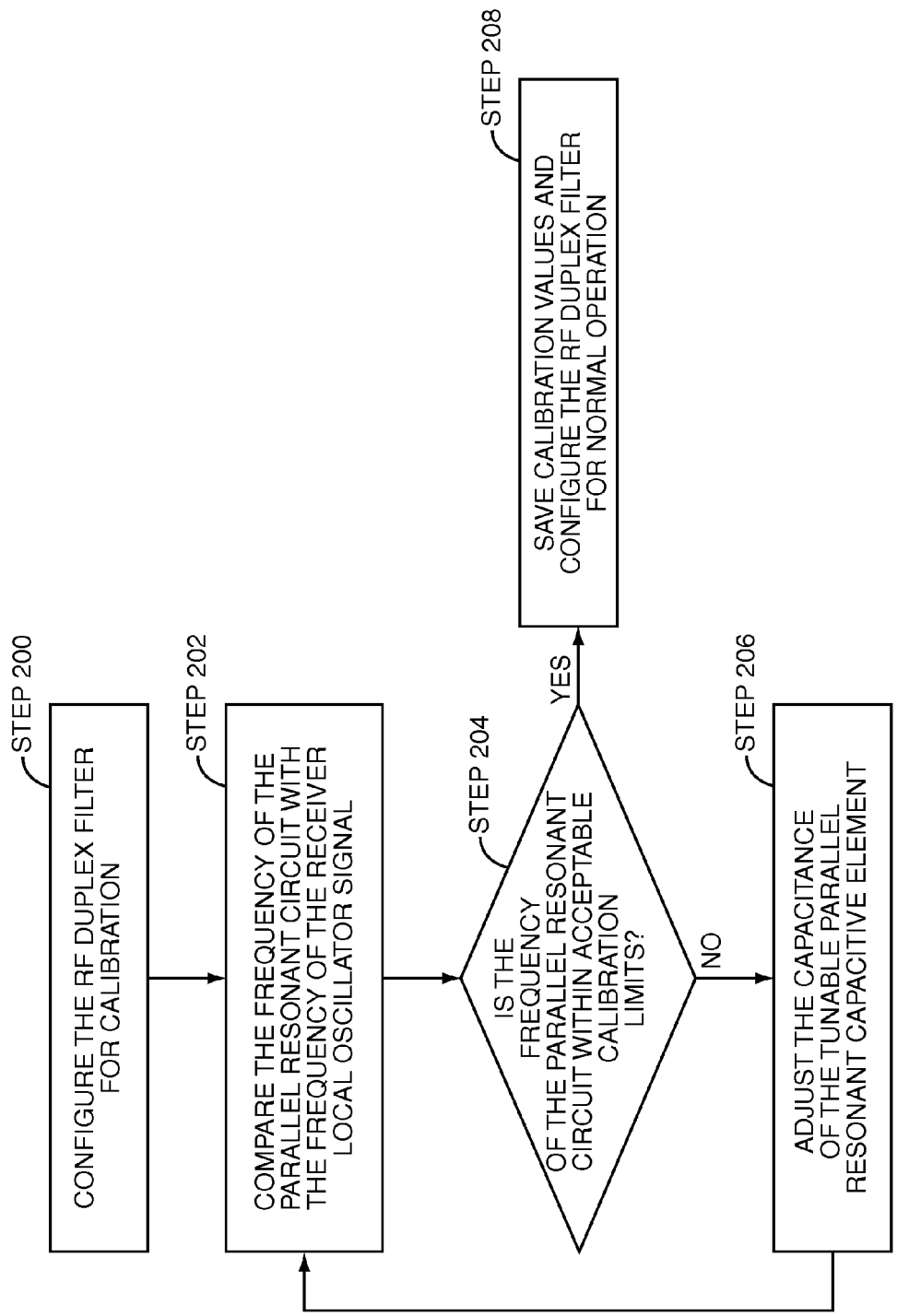

FIG. 12 illustrates a method for calibrating the parallel resonant circuit.

Figure 13:
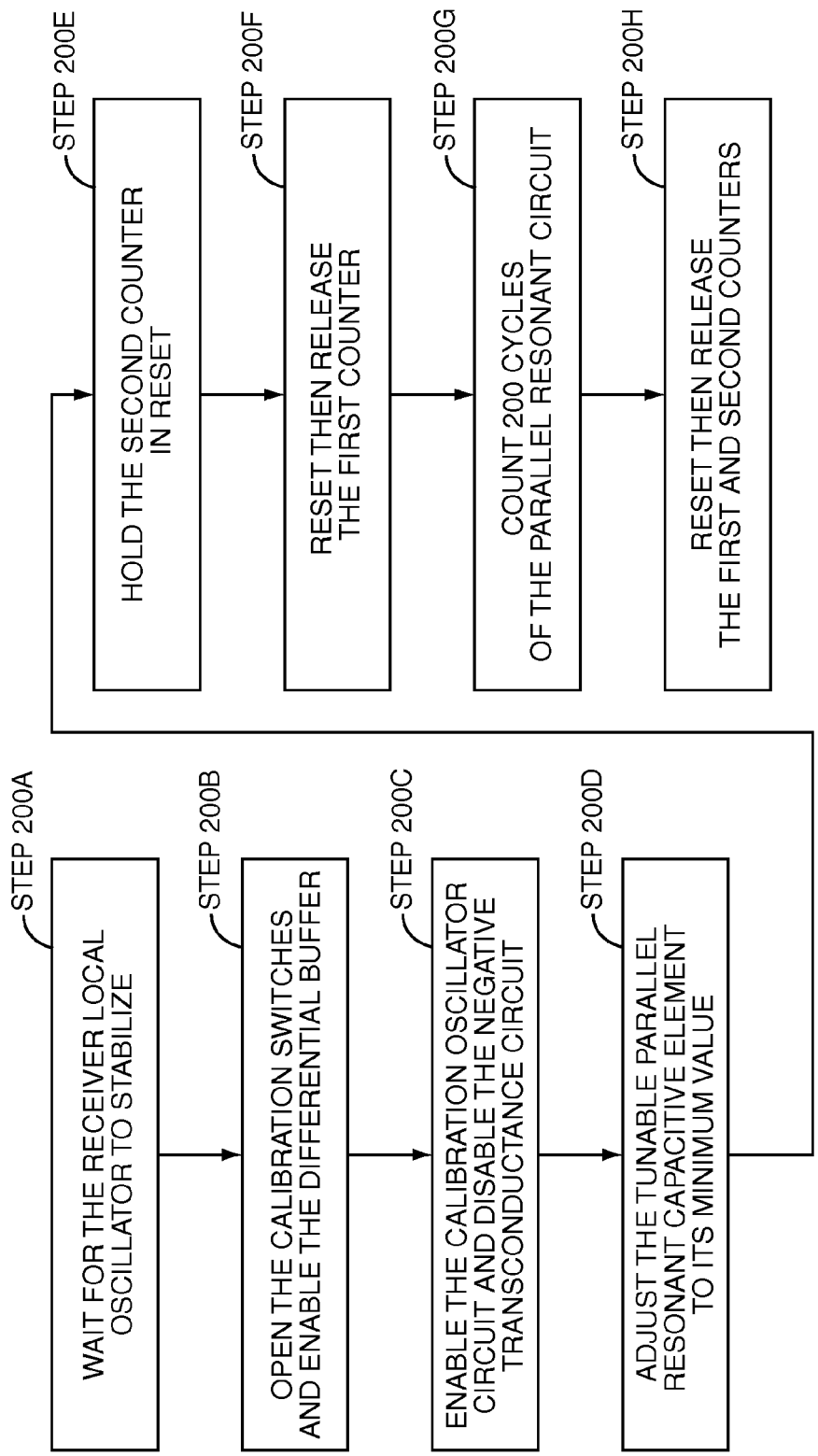

FIG. 13 shows details of the first method step illustrated in FIG. 12.

Figure 14:
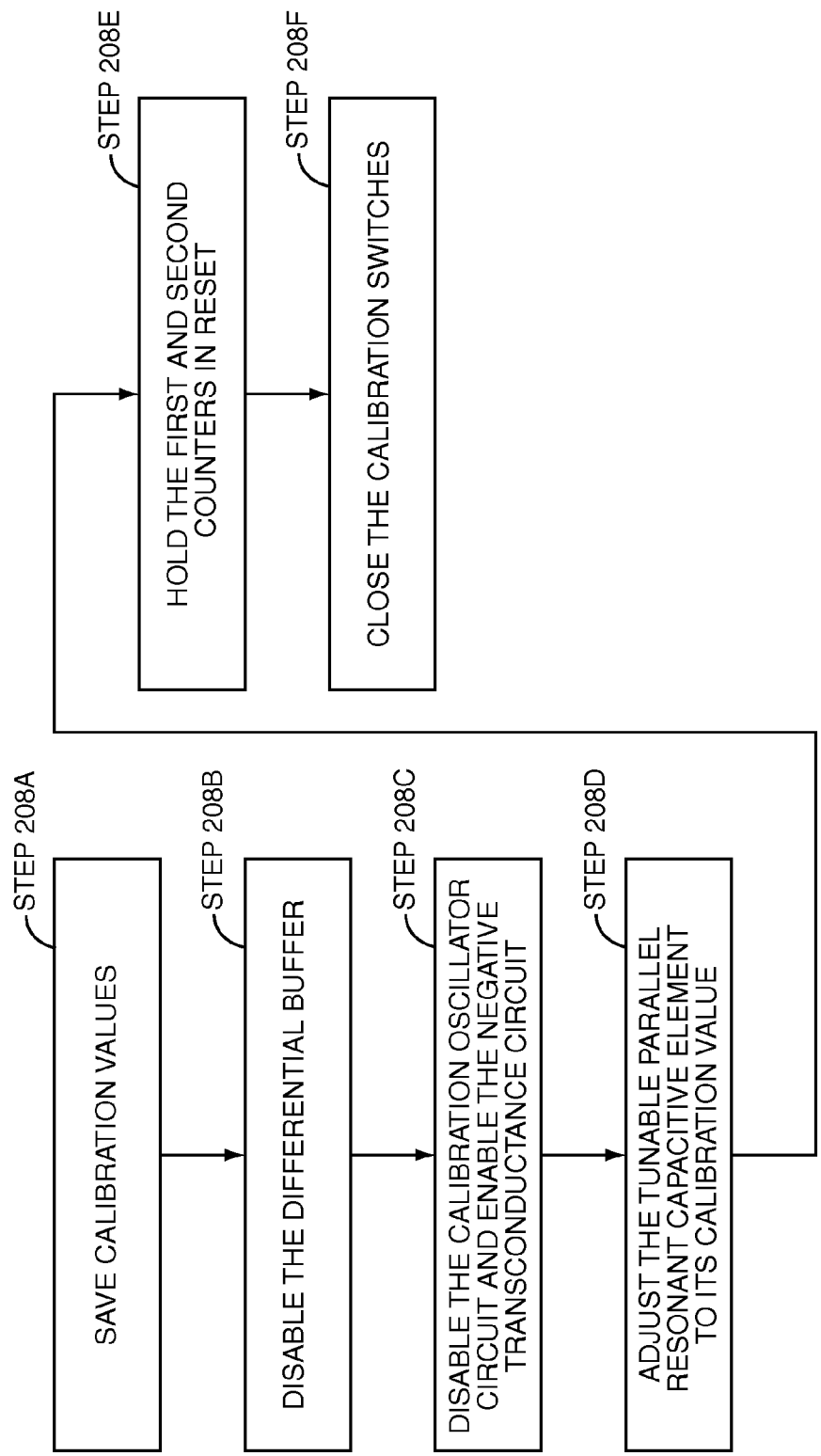

FIG. 14 shows details of the last method step illustrated in FIG. 12.

Figure 1:
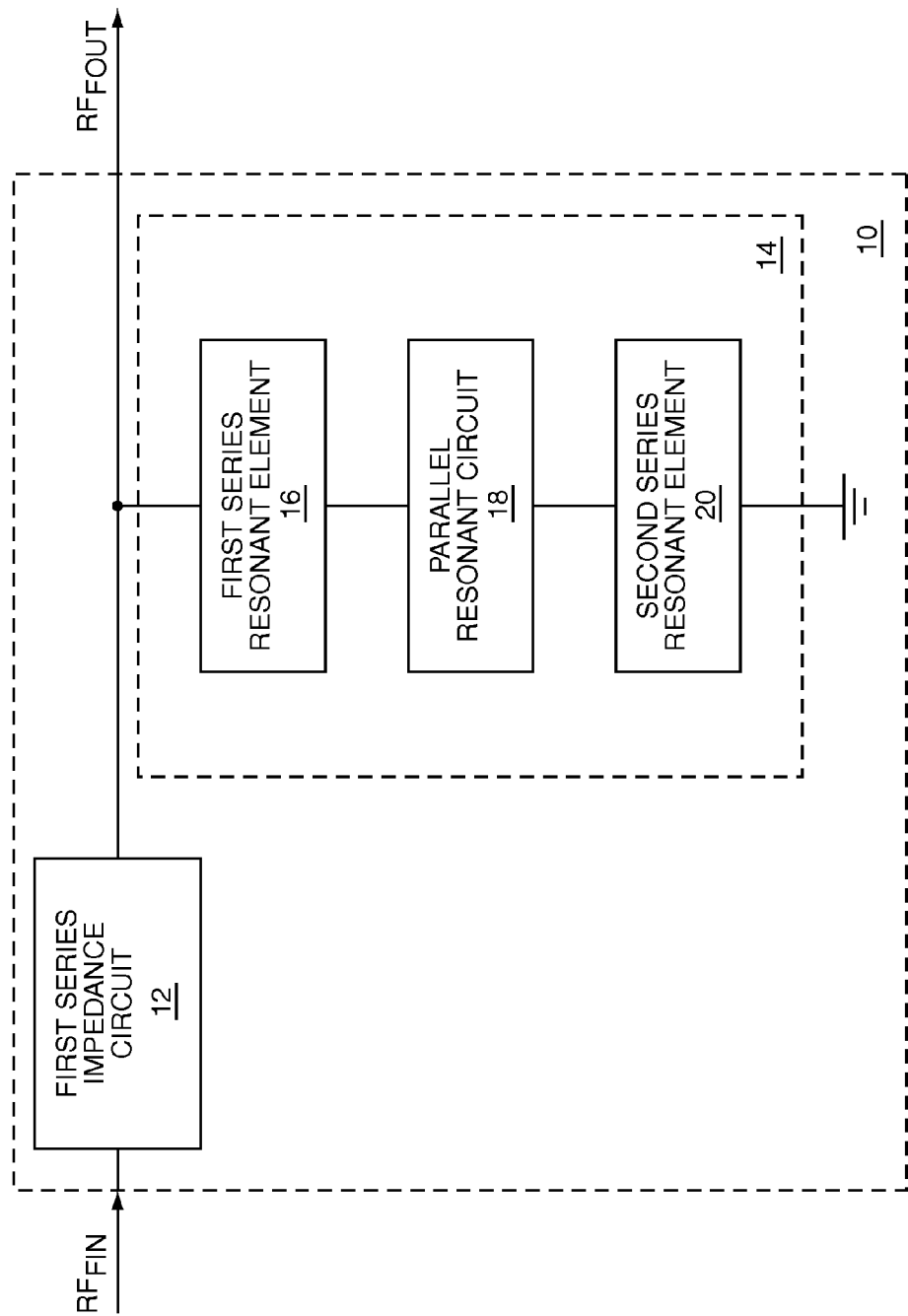
FIG. 1 shows one embodiment of the present invention, which is an RF duplex filter.
Figure 15:
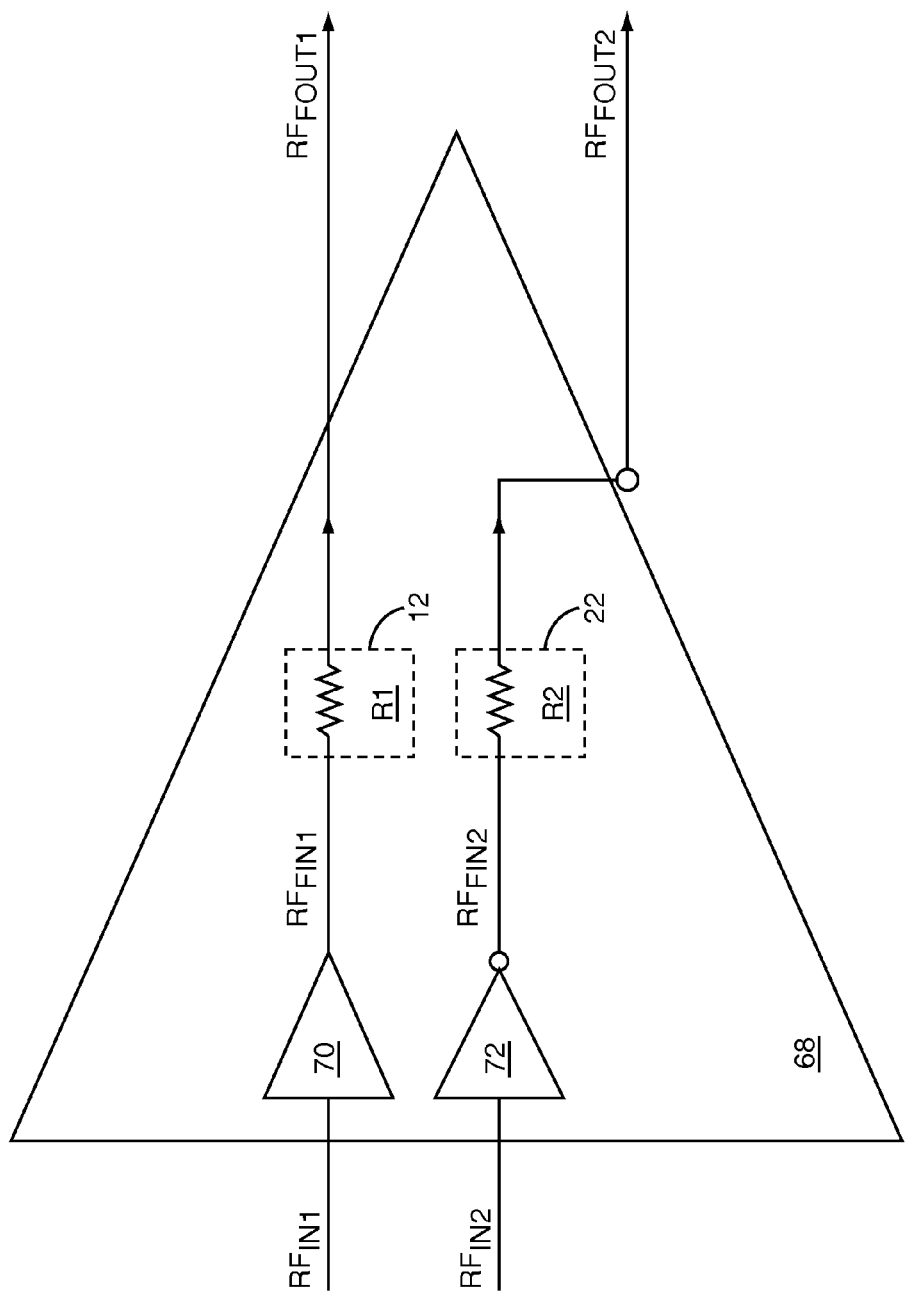

FIG. 15 shows the series impedance circuits illustrated in FIG. 1 as part of an LNA.

Figure 16:
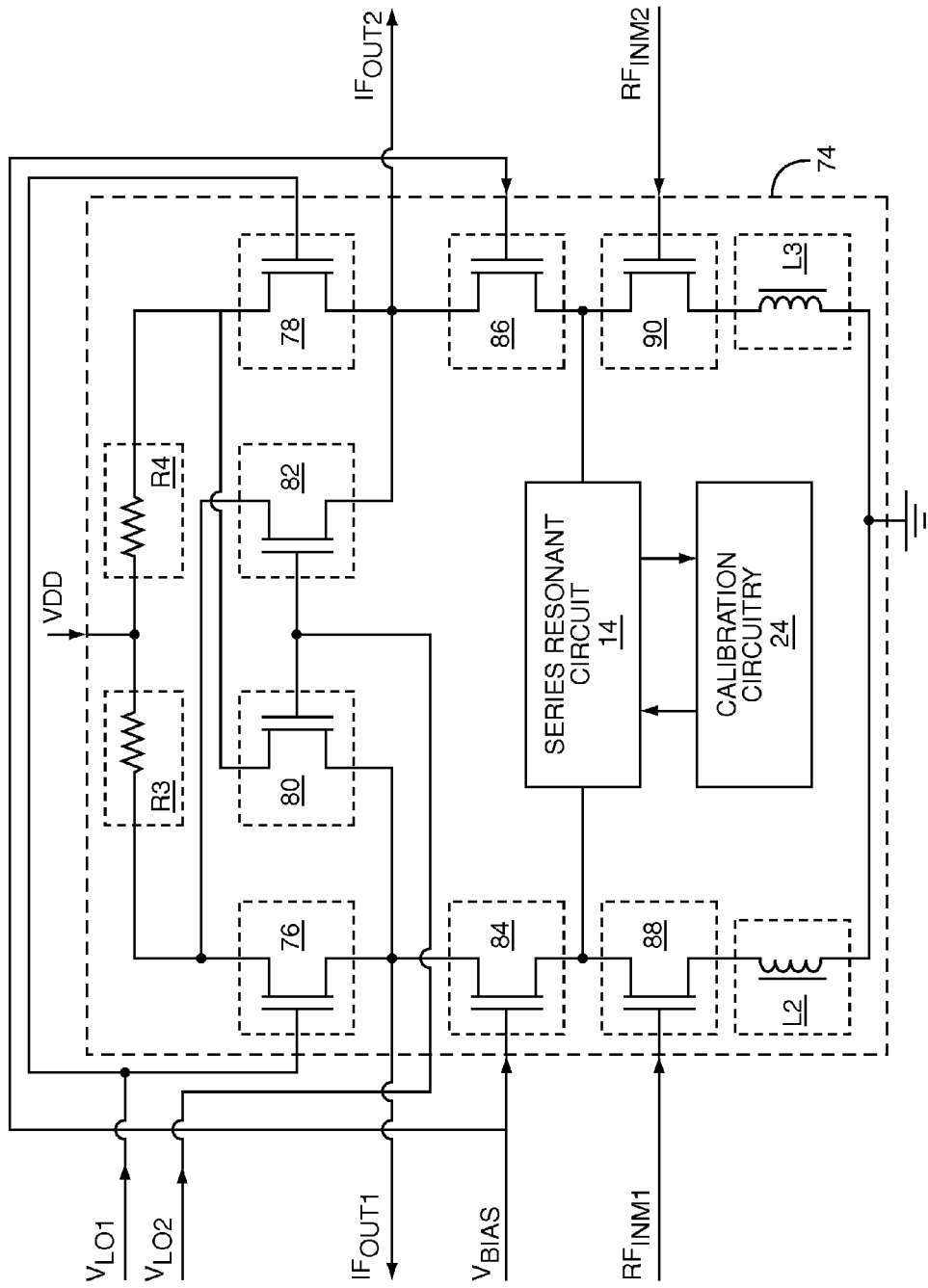

FIG. 16 shows the present invention used in an RF mixer.

Figure 17:
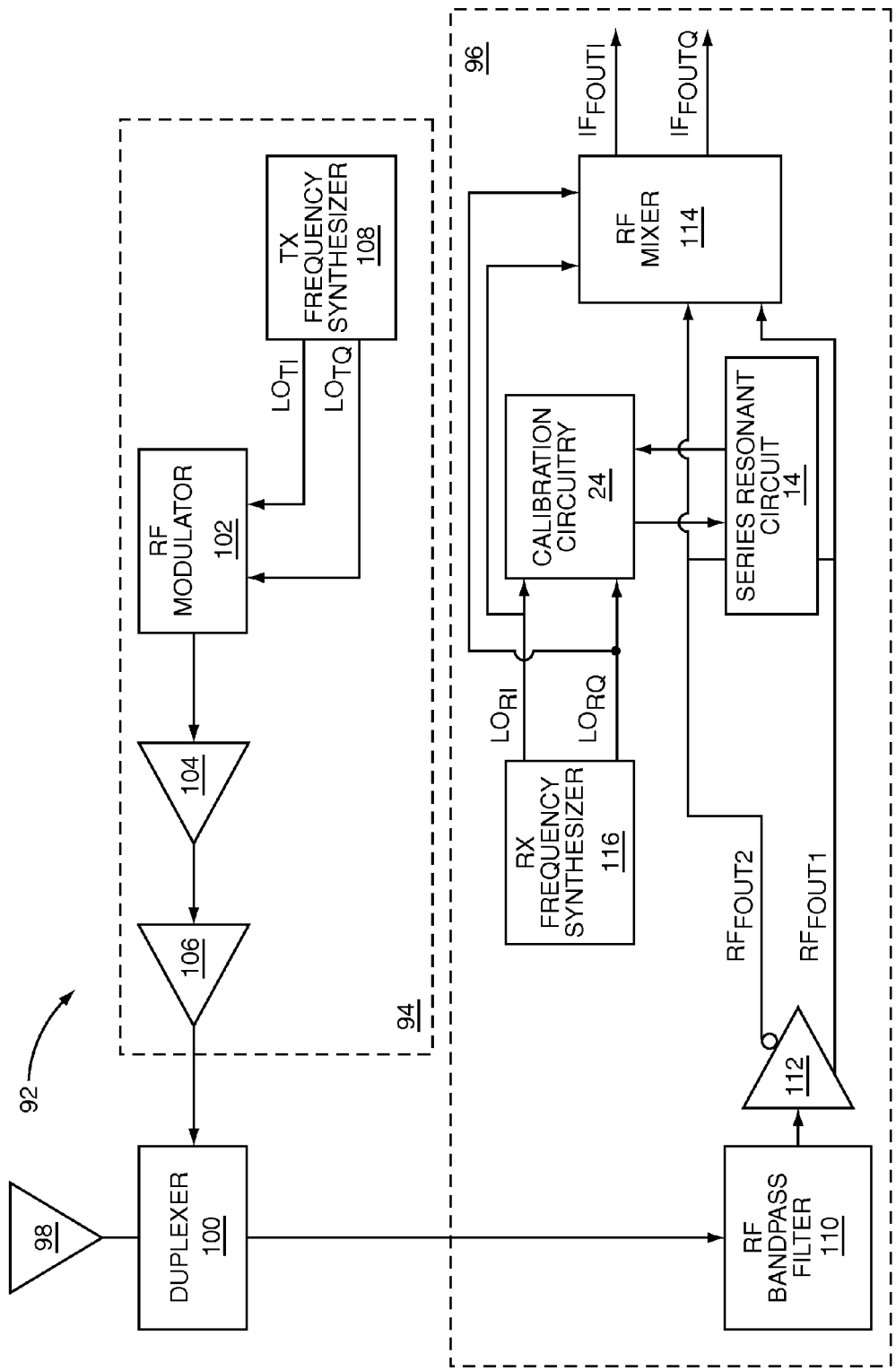

FIG. 17 shows the present invention used in a full duplex transceiver.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is an RF duplex filter that is used to remove transmit signals from the receive path of a full duplex transceiver. The RF duplex filter includes a notch filter for blocking signals at a transmit frequency and a bandpass filter for enhancing signals at a receive frequency. The notch filter is formed with series resonant elements and the bandpass filter is formed with parallel resonant elements. One embodiment of the present invention may include tunable resonant elements for tuning the notch filter to a transmit frequency, tuning the bandpass filter to a receive frequency, or both. Calibration circuitry may be included in the full duplex receiver for adjusting the tunable resonant elements. The present invention includes a method for calibrating the tunable resonant elements. The RF duplex filter may be coupled to the receive path, or integrated into a low noise amplifier (LNA) or an RF mixer. Active circuitry may be used to compensate for losses in the RF duplex filter.

The present invention may be used to replace SAW filters in the receive path. The RF duplex filter may include single-ended signals, differential signals, quadrature signals, or any combination thereof. The present invention may be used in a full duplex communications system, such as a Wideband Code Division Multiple Access (WCDMA) system, a half duplex communications system, such as Enhanced Data rate for Global Evolution (EDGE), or a multimode communications system that may include at least one full duplex operating mode, at least one half duplex operating mode, or both.

FIG. 1 shows one embodiment of the present invention, which is an RF duplex filter 10. An RF filter input signal $RF_{FIN}$ feeds a first series impedance circuit 12, which is coupled to a series resonant circuit 14 to form the RF duplex filter 10 and provide an RF filter output signal $RF_{FOUT}$. The series resonant circuit 14 includes at least one first series resonant element 16, a parallel resonant circuit 18, and at least one second series resonant element 20 coupled in series. The series resonant circuit 14 has a series resonant frequency that is approximately equal to a transmit frequency and thus presents a high impedance at all frequencies except the transmit frequency. The first series impedance circuit 12 may present a nominal impedance at all frequencies; therefore, the circuits 12, 14 form a notch filter with the notch located at the transmit frequency. The parallel resonant circuit 18 has a parallel resonant frequency that is approximately equal to a receive frequency, and thus presents a low impedance at all frequencies except the receive frequency, and a high impedance at the receive frequency. The combination of a low impedance at the transmit frequency and a high impedance at the receive frequency provides an effective filter for removing transmit signals from the receive path with minimal attenuation of receive signals.

Figure 2:
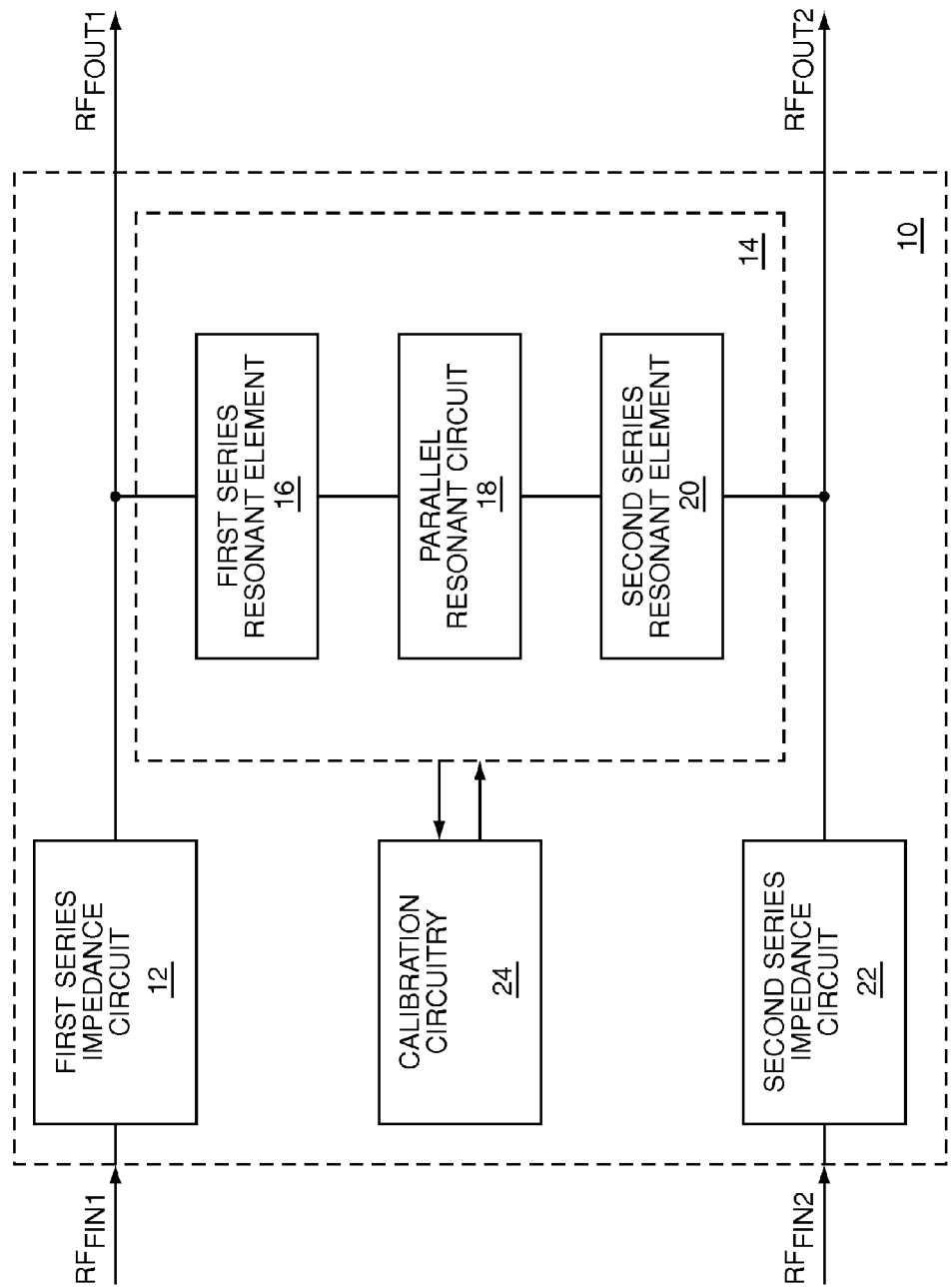
FIG. 2 shows a differential RF duplex filter with calibration circuitry.

FIG. 2 shows a differential RF duplex filter 10 with calibration circuitry 24. A first RF filter input signal $RF_{FIN1}$ feeds the first series impedance circuit 12, and a second RF filter input signal $RF_{FIN2}$ feeds a second series impedance circuit 22. Both series impedance circuits 12, 22 are coupled to the series resonant circuit 14 to form the differential RF duplex filter 10 and provide a first RF filter output signal $RF_{FOUT1}$ and a second RF filter output signal $RF_{FOUT2}$. Calibration circuitry 24 provides means for adjusting tunable elements in the parallel resonant circuit 18, the first series resonant element 16, the second series resonant element 20, or any combination thereof.

FIG. 3 shows details of the series resonant circuit 14 illustrated in FIG. 2. The first series resonant element 16 includes a first series resonant capacitive element C1. The second series resonant element 20 includes a second series resonant capacitive element C2. The parallel resonant circuit 18 includes a parallel resonant inductive element L1 coupled in parallel with a first parallel resonant capacitive element C3.

FIG. 4 shows the series resonant circuit 14 with tunable elements and the series impedance circuits 12, 22 with resistive elements. The first series resonant element 16 includes a first tunable series resonant capacitive element C4 coupled in parallel with the first series resonant capacitive element C1. The second series resonant element 20 includes a second tunable series resonant capacitive element C5 coupled in parallel with the second series resonant capacitive element C2. The parallel resonant circuit 18 includes a tunable parallel resonant capacitive element C6 coupled in parallel with the first parallel resonant capacitive element C3. The first series impedance circuit 12 includes a first resistive element R1. The second series impedance circuit 22 includes a second resistive element R2. The parallel resonant frequency occurs when the impedance of the parallel resonant inductive element L1 is equal to the impedance of the first parallel resonant capacitive element C3 in parallel with the tunable parallel resonant capacitive element C6; therefore, the parallel resonant frequency is equal to:

$$F_{PARALLEL\_RES}=1/\{2\pi[(L1)(C3+C6)]^{1/2}\}. \qquad \text{EQUATION 1}$$

The series resonant frequency occurs when the impedance of the parallel resonant circuit 18 is equal to the sum of the impedances of the series resonant elements 16, 20; therefore, the series resonant frequency is equal to:

$$F_{SERIES\_RES}=1/\{2\pi[(L1)(CS+C3+C6)]^{1/2}\}, \qquad \text{EQUATION 2}$$

where $$CS=(C1+C4)(C2+C5)/(C1+C2+C4+C5). \qquad \text{EQUATION 3}$$

Parasitic capacitances may influence the effective capacitances of the resonant capacitive elements C1, C2, C3, C4, C5, C6, which may influence the resonant frequencies.

FIG. 5 shows one embodiment of the present invention, wherein the parallel resonant circuit 18 is adjusted such that the parallel resonant frequency is substantially matched to the receive frequency. A first calibration switch 26 is coupled between the first series element 16 and the parallel resonant circuit 18. A second calibration switch 28 is coupled between the second series element 20 and the parallel resonant circuit 18. The calibration switches 26, 28 are controlled by a switch enable signal SWEN and are used to isolate the parallel resonant circuit 18 during calibration. The calibration circuitry 24 provides the switch enable signal SWEN, a calibration oscillator enable signal OSCEN, and a capacitive element adjustment signal CAPADJ. The calibration oscillator enable signal OSCEN enables a calibration oscillator in the parallel resonant circuit 18 to measure the parallel resonant frequency during calibration. The capacitive element adjustment signal CAPADJ is used to adjust the value of the tunable parallel resonant capacitive element C6 such that the parallel resonant frequency is substantially matched to the receive frequency. The parallel resonant circuit 18 provides a first calibration oscillator signal PRC1 and a second calibration oscillator signal PRC2 to the calibration circuitry 24 to measure the parallel resonant frequency.

FIG. 6 shows details of the parallel resonant circuit 18 illustrated in FIG. 5. The capacitive element adjustment signal CAPADJ is used to adjust the value of the tunable parallel resonant capacitive element C6. The calibration oscillator signals PRC1, PRC2 are taken from the parallel coupling of the tunable parallel resonant capacitive element C6, the first parallel resonant capacitive element C3, and the parallel resonant inductive element L1.

FIG. 7 shows details of the parallel resonant circuit 18 using a switched capacitor bank in place of the tunable parallel resonant capacitive element C6. The switched capacitor bank includes a second parallel resonant capacitive element C7, a third parallel resonant capacitive element C8, and a fourth parallel resonant capacitive element C9, which are switched in parallel with the first parallel resonant capacitive element C3 and the parallel resonant inductive element L1 using a first capacitor bank switch 30, a second capacitor bank switch 32, and a third capacitor bank switch 34, respectively, based on the capacitive element adjustment signal CAPADJ. Other embodiments of the switched capacitor bank may use any number of switched capacitive elements.

FIG. 8 shows details of the parallel resonant circuit 18 with a calibration oscillator circuit 36 and a negative transconductance circuit 38. During calibration, the calibration oscillator enable signal OSCEN enables the calibration oscillator circuit 36 to measure the parallel resonant frequency. The calibration oscillator circuit 36 oscillates at the resonant frequency determined by the tunable parallel resonant capacitive element C6, the first parallel resonant capacitive element C3, and the parallel resonant inductive element L1. Some embodiments of the present invention may include the negative transconductance circuit 38 to compensate for losses in passive elements in the parallel resonant circuit 18. The parallel resonant inductive element L1 may be particularly prone to losses, particularly if the parallel resonant inductive element L1 is part of an integrated circuit die. Off-die discrete components may not exhibit significant losses. The negative transconductance circuit 38 is an active circuit that presents a negative transconductance to the parallel coupling of the tunable parallel resonant capacitive element C6, the first parallel resonant capacitive element C3, and the parallel resonant inductive element L1 to compensate for resistive characteristics of the passive elements. During calibration, the calibration oscillator enable signal OSCEN may disable or reduce the negative transconductance of the negative transconductance circuit 38.

FIG. 9 shows details of the calibration oscillator circuit 36 illustrated in FIG. 8. A first calibration oscillator transistor element 40 is cross-coupled with a second calibration oscillator transistor element 42 to form an oscillator circuit. A calibration oscillator enable transistor element 44 receives the calibration oscillator enable signal OSCEN to enable or disable the calibration oscillator transistor elements 40, 42.

FIG. 10 shows details of the negative transconductance circuit 38 illustrated in FIG. 8. A negative transconductance enable transistor element 46 is coupled between a DC supply (VDD) and first and second negative transconductance transistor elements 48, 50. The negative transconductance enable transistor element 46 receives the calibration oscillator enable signal OSCEN to enable or disable the first negative transconductance transistor element 48 and the second negative transconductance transistor element 50. The gates of the negative transconductance transistor elements 48, 50 are coupled in parallel with the tunable parallel resonant capacitive element C6 (not shown), the first parallel resonant capacitive element C3 (not shown), and the parallel resonant inductive element L1 (not shown). A first current source 52 is coupled to the source of the first negative transconductance transistor element 48. A second current source 54 is coupled to the source of the second negative transconductance transistor element 50. A first negative transconductance capacitive element C10 is coupled between the gate and the source of the first negative transconductance transistor element 48. A second negative transconductance capacitive element C11 is coupled between the gate and the source of the second negative transconductance transistor element 50. A third negative transconductance capacitive element C12 is coupled between the sources of the negative transconductance transistor elements 48, 50.

FIG. 11 shows details of the calibration circuitry 24 illustrated in FIG. 5. A differential buffer 56 receives the differential calibration oscillator signals PRC1, PRC2 and provides buffered differential calibration oscillator signals to an RF mixer 58 and a first counter 60. The RF mixer 58 mixes the buffered differential calibration oscillator signals with a receiver local oscillator signal RXLO to create a mixer output signal that is the difference between the buffered differential calibration oscillator signals and the receiver local oscillator signal RXLO. The mixer output signal feeds a mixer output buffer 62, which provides a buffered mixer output signal to a second counter 64. The first counter 60 receives a first counter reset signal RESET1 from calibration control circuitry 66. The second counter 64 receives a second counter reset signal RESET2 from the calibration control circuitry 66. The first counter 60 provides a first counter carry signal CARRY1 to the calibration control circuitry 66. The second counter 64 provides a second counter carry signal CARRY2 to the calibration control circuitry 66. The calibration control circuitry 66 provides a buffer enable signal BUFEN to the differential buffer 56. In addition, the calibration control circuitry 66 provides the calibration oscillator enable signal OSCEN and the capacitive element adjustment signal CAPADJ.

When the first counter reset signal RESET1 is active, the counters in the first counter 60 are reset and the first counter carry signal CARRY1 is reset. When the second counter reset signal RESET2 is active, the counters in the second counter 64 are reset and the second counter carry signal CARRY2 is reset. When either of the counters 60, 64 reaches its maximum count value, its respective counter carry signal CARRY1, CARRY2 becomes active. In one embodiment of the present invention, the maximum count value of the first counter 60 is approximately 100. The maximum count value of the second counter 64 is approximately 2. In an alternate embodiment of the present invention, the maximum count value of the first counter 60 is approximately 200. The first counter 60 counts each cycle of the differential calibration oscillator signals PRC1, PRC2. The second counter 64 counts the difference between the buffered differential calibration oscillator signals and the receiver local oscillator signal RXLO. If the frequency of the receiver local oscillator signal RXLO is almost equal to the frequency of the differential calibration oscillator signals PRC1, PRC2, then the frequency of the signal counted by the second counter 64 will be low; therefore, the objective of calibrating the parallel resonant circuit 18 is to reduce the frequency counted by the second counter 64 below a calibration threshold.

FIG. 12 illustrates a method for calibrating the parallel resonant circuit 18. The calibration process begins by configuring the RF duplex filter 10 for calibration (Step 200). The frequency of the parallel resonant circuit 18 is compared with the frequency of the receiver local oscillator signal RXLO (Step 202). This comparison is done by examining which of the counters 60, 64 reaches its maximum value first. If the second counter 64 reached its maximum value first, then the frequency of the parallel resonant circuit 18 is not within acceptable calibration limits (Step 204); therefore, the capacitance of the tunable parallel resonant capacitive element C6 is adjusted (Step 206), the counter reset signals RESET1, RESET2 are toggled to reset, the counters 60, 64 are released, and the calibration process loops back to Step 202. If the first counter 60 reached its maximum value first, then the frequency of the parallel resonant circuit 18 is within acceptable calibration limits (Step 204); therefore, the calibration values are saved and the RF duplex filter 10 is configured for normal operation (Step 208).

FIG. 13 shows details of the first method step (Step 200) illustrated in FIG. 12. The calibration process begins by waiting for the receiver local oscillator to stabilize (Step 200A). The calibration switches 26, 28 are opened and the differential buffer 56 is enabled (Step 200B). The calibration oscillator circuit 36 is enabled, and the negative transconductance circuit 38 is disabled (Step 200C). The capacitance of the tunable parallel resonant capacitive element C6 is adjusted to its minimum value (Step 200D). The second counter 64 is held in reset (Step 200E). The first counter reset signal RESET1 is toggled to reset, then the first counter 60 is released (Step 200F). The calibration process waits until 200 cycles of the parallel resonant circuit 18 are counted (Step 200G) to provide time to stabilize. The first and second counters 60, 64 are reset then released (Step 200H).

FIG. 14 shows details of the last method step (Step 208) illustrated in FIG. 12. First, the calibration values are saved (Step 208A).

The differential buffer 56 is disabled (Step 208B). The calibration oscillator circuit 36 is disabled, and the negative transconductance circuit 38 is enabled (Step 208C). The capacitance of the tunable parallel resonant capacitive element C6 is adjusted to its calibration value (Step 208D). The first and second counters 60, 64 are held in reset (Step 208E). The calibration switches 26, 28 are then closed (Step 208F).

FIG. 15 shows the series impedance circuits 12, 22 as part of an LNA 68. A first differential RF input signal $RF_{IN1}$ and a second differential RF input signal $RF_{IN2}$ feed an ideal non-inverting amplifier 70 and an ideal inverting amplifier 72, respectively. The ideal amplifiers 70, 72 provide the RF filter input signals $RF_{FIN1}$, $RF_{FIN2}$ to the series impedance circuits 12, 22, which are the output impedances of the LNA 68; therefore, the RF filter output signals $RF_{FOUT1}$, $RF_{FOUT2}$ are provided by the output impedances of the LNA 68.

FIG. 16 shows the present invention used in an RF mixer 74. A first differential local oscillator signal $V_{LO1}$ feeds the gates of a first mixer transistor element 76 and a second mixer transistor element 78. A second differential local oscillator signal $V_{LO2}$ feeds the gates of a third mixer transistor element 80 and a fourth mixer transistor element 82. The drains of the first and fourth mixer transistor elements 76, 82 are coupled to a direct current (DC) power supply VDD through a first mixer resistive element R3. The drains of the second and third mixer transistor elements 78, 80 are coupled to the direct current DC power supply VDD through a second mixer resistive element R4. The sources of the first and third mixer transistor elements 76, 80 are coupled to the drain of a fifth mixer transistor element 84, and provide a first differential down converted output signal $IF_{OUT1}$. The sources of the second and fourth mixer transistor elements 78, 82 are coupled to the drain of a sixth mixer transistor element 86, and provide a second differential down converted output signal $IF_{OUT2}$. The gates of the fifth and sixth mixer transistor elements 84, 86 are coupled to a mixer bias signal $V_{BIAS}$. The source of the fifth mixer transistor elements 84 is coupled to the drain of a seventh mixer transistor element 88. The source of the sixth mixer transistor elements 86 is coupled to the drain of an eighth mixer transistor element 90. The source of the seventh mixer transistor element 88 is coupled to ground through a first mixer inductive element L2. The source of the eighth mixer transistor element 90 is coupled to ground through a second mixer inductive element L3. The gate of the seventh mixer transistor element 88 receives a first differential mixer RF input signal $RF_{INM1}$. The gate of the eighth mixer transistor element 90 receives a second differential mixer RF input signal $RF_{INM2}$. A series resonant circuit 14 is coupled between the drains of the seventh and eighth mixer transistor elements 88, 90. Calibration circuitry 24 is coupled to the series resonant circuit 14 to allow calibration of the series resonant circuit 14.

The source output impedance of the fifth mixer transistor element 84 and the drain output impedance of the seventh mixer transistor element 88 provide the first series impedance circuit 12. The source output impedance of the sixth mixer transistor element 86 and the drain output impedance of the eighth mixer transistor element 90 provide the second series impedance circuit 22. In an alternate embodiment of the RF mixer 74 (not shown), an additional series resonant circuit 14 is coupled between the drains of the fifth and sixth mixer transistor elements 84, 86 to provide additional filtering. Additional calibration circuitry 24 may be coupled to the additional series resonant circuit 14.

Those skilled in the art will understand the concepts of the invention and will recognize applications of these concepts not particularly addressed herein. Other embodiments of the present invention may include at least one series resonant element and at least one parallel resonant element. At least one of the series and parallel resonant elements may be located within at least one integrated circuit (IC) die, within at least one laminated module, within at least one external surface mounted device, or any combination thereof.

FIG. 17 shows the present invention used in a full duplex transceiver 92, which may be used in a full duplex RF system such as a WCDMA system, including a multimode RF system that includes WCDMA and EDGE. The full duplex transceiver 92 includes an RF transmitter 94 and an RF receiver 96, which are both coupled to an antenna 98 through a duplexer 100. The duplexer 100 provides attenuation between the RF transmitter 94 and the RF receiver 96; however, some signals at the transmit frequency may by coupled into the receiver 96 through the duplexer 100, through common circuit parasitics, or both; therefore, filtering out signals at the transmit frequency may be beneficial.

The RF transmitter 94 includes an RF modulator 102, which provides a modulated RF transmit signal to at least one driver stage 104. The driver stage 104 feeds a final stage 106, which provides an amplified modulated RF transmit signal to the duplexer 100. The duplexer 100 routes the amplified modulated RF transmit signal to the antenna 98. A transmitter frequency synthesizer 108 provides an in-phase transmitter local oscillator signal $LO_{TI}$ and a quadrature-phase transmitter local oscillator signal $LO_{TQ}$ to the RF modulator 102, which modulates the transmitter local oscillator signals $LO_{TI}$, $LO_{TQ}$ to create the modulated RF transmit signal.

The RF receiver 96 includes an RF bandpass filter 110, which receives RF signals from the antenna 98 through the duplexer 100. The RF bandpass filter 110 feeds filtered RF signals to a differential LNA 112, which is part of an RF duplex filter that removes signals at the transmit frequency. The differential LNA 112 feeds an RF mixer 114 and a series resonant circuit 14, which is part of the RF duplex filter. The output impedance of the differential LNA 112 provides the first and second series impedance circuits 12, 22 of the RF duplex filter, which includes calibration circuitry 24. The RF duplex filter provides differential notch filtered RF signals $RF_{FOUT1}$, $RF_{FOUT2}$ to the RF mixer 114. A receiver frequency synthesizer 116 provides an in-phase receiver local oscillator signal $LO_{RI}$ and a quadrature-phase receiver local oscillator signal $LO_{RQ}$ to the RF mixer 114 and the calibration circuitry 24. The RF mixer down converts the differential notch filtered RF signals $RF_{FOUT1}$, $RF_{FOUT2}$ into quadrature intermediate frequency (IF) signals $IF_{FOUTI}$, $IF_{FOUTQ}$, which are processed by downstream circuitry.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) duplex filter comprising:
an integrated circuit die including a series impedance circuit and a series resonant circuit, wherein:
the series impedance circuit: includes at least one series impedance element coupled to the series resonant circuit to form at least one RF output that provides at least one RF output signal, and adapted to receive an RF input signal; and
the series resonant circuit includes
a parallel resonant circuit having a parallel resonant frequency that is approximately equal to a receive frequency, wherein the at least one series parallel resonant circuit includes a switched capacitor bank in parallel with a first parallel resonant capacitive element, a parallel resonant inductive element, and a negative transconductance circuit; and
at least one series resonant element coupled in series with the parallel resonant circuit; and
wherein the series resonant circuit has a series resonant frequency that is approximately equal to a transmit frequency, and wherein the at least one RF output signal is based on the at least one RF input signal and filtering characteristics provided by the series impedance circuit and the series resonant circuit.

2. The RF duplex filter of claim 1 wherein the at least one series resonant element comprises at least one capacitive element.

3. The RF duplex filter of claim 1 wherein the at least one series resonant element comprises at least one tunable reactive element.

4. The RF duplex filter of claim 1 wherein the at least one series impedance element comprises at least one output impedance of at least one active circuit.

5. The RF duplex filter of claim 1 wherein the parallel resonant circuit comprises a negative transconductance circuit.

6. The RF duplex filter of claim 1 wherein the series resonant circuit comprises at least one calibration switching element coupled in series with the parallel resonant circuit and the at least one series resonant element, wherein the at least one calibration switching element is configured to isolate the parallel resonant circuit from the at least one series resonant element during calibration of the parallel resonant circuit.

7. The RF duplex filter of claim 1 wherein the parallel resonant circuit further comprises a calibration oscillator circuit.

8. The RF duplex filter of claim 7 wherein:
the RF duplex filter further comprises calibration circuitry;
the parallel resonant circuit further comprises at least one tunable reactive element; and
the at least one tunable reactive element is tuned such that the parallel resonant frequency is approximately equal to the receive frequency.

9. The RF duplex filter of claim 8 wherein the calibration circuitry comprises an RF mixer that provides at least one down converted output signal, and the at least one tunable reactive element is tuned based on the down converted output signal.

10. The RF duplex filter of claim 9 wherein the RF mixer is adapted to mix at least one receiver local oscillator signal with at least one parallel resonant circuit signal to provide the at least one down converted output signal.

11. The RF duplex filter of claim 10 wherein the calibration circuitry further comprises:
an RF mixer counter adapted to receive the at least one down converted output signal and provide an RF mixer counter output signal; and
a parallel resonant circuit counter adapted to receive the at least one parallel resonant circuit signal and provide a parallel resonant circuit counter output signal, wherein the at least one tunable reactive element is tuned based on the RF mixer counter output signal and the parallel resonant circuit counter output signal.

12. The RF duplex filter of claim 1 wherein the receive frequency is approximately equal to a frequency of a receiver local oscillator signal.

13. The RF duplex filter of claim 1 wherein the RF duplex filter is used in a low noise amplifier (LNA).

14. The RF duplex filter of claim 1 wherein the RF duplex filter is used in an RF mixer.

15. The RF duplex filter of claim 1 wherein the RF duplex filter is used in a full duplex receiver comprising an RF receiver and an RF transmitter such that the RF receiver is capable of receiving RF signals and the RF transmitter is capable of transmitting RF signals simultaneously.

16. A method for tuning an RF duplex filter comprising:
providing an integrated circuit die including:
a series impedance circuit coupled to a series resonant circuit, wherein the series resonant circuit includes a parallel resonant circuit having at least one tunable element coupled in parallel with a negative transconductance circuit, wherein the parallel resonant circuit is coupled in series with at least one series resonant element; and
calibration circuitry coupled in parallel with the parallel resonant circuit, wherein the calibration circuitry includes a calibration oscillator coupled in parallel with a parallel resonant circuit, wherein the calibration circuit is adapted to measure a receive frequency and a resonant frequency of the parallel resonant circuit, and tune the at least one tunable element;
enabling the calibration oscillator and disabling the negative transconductance circuit to configure the RF duplex filter for calibration;
comparing, with the calibration circuitry, the receive frequency with the resonant frequency; and
tuning, with the calibration circuitry, the at least one tunable element such that the resonant frequency is approximately equal to the receive frequency.

* * * * *